United States Patent

Kobayashi et al.

[11] Patent Number: 5,470,451
[45] Date of Patent: Nov. 28, 1995

[54] SPUTTERING APPARATUS

[75] Inventors: Masahiko Kobayashi; Nobuyuki Takahashi, both of Fuchu, Japan

[73] Assignee: Anelva Corporation, Tokyo, Japan

[21] Appl. No.: 249,271

[22] Filed: May 25, 1994

[30] Foreign Application Priority Data

Jun. 8, 1993 [JP] Japan .................................. 5-164127

[51] Int. Cl.$^6$ ............................ C23C 14/34; C23C 14/52; C23C 14/54
[52] U.S. Cl. ................... 204/298.03; 204/298.07; 204/298.11
[58] Field of Search ..................... 204/298.07, 298.11, 204/298.03

[56] References Cited

U.S. PATENT DOCUMENTS

| | | | |
|---|---|---|---|
| 4,425,218 | 1/1984 | Robinson | 204/298.07 |
| 4,946,576 | 8/1990 | Dietrich et al. | 204/298.06 |
| 5,108,569 | 4/1992 | Gilboa et al. | 204/192.13 |
| 5,228,968 | 7/1993 | Zejda | 204/298.07 |

FOREIGN PATENT DOCUMENTS

| | | | |
|---|---|---|---|
| 3530087 | 2/1987 | Germany | 204/298.07 |
| 63-303061 | 12/1988 | Japan | 204/298.07 |

Primary Examiner—Aaron Weisstuch
Attorney, Agent, or Firm—Oliff & Berridge

[57] ABSTRACT

A sputtering apparatus in which transfer of a substrate and formation of a thin film on the substrate are performed in a face-up manner, the apparatus comprising a cylindrical shield member provided so as to surround a plasma discharge space in a substantially tightly enclosing state, and a process gas inlet means having gas outlet openings formed in an inner surface thereof. The cylindrical shield member is provided in its inside with a ring-like or cylindrical path so as to communicate with the process gas inlet means and so as to have a plurality of gas outlet openings. Further, a hole for inserting a pressure gauge is formed in the inner surface of the shield member.

5 Claims, 4 Drawing Sheets

SPUTTERING APPARATUS

BACKGROUND OF THE INVENTION

1. Field of the Invention

The invention relates to a sputtering apparatus, and particularly relates to a sputtering apparatus suitable for stabilizing and improving film quality of a thin film deposited on a substrate. More particularly, it relates to an improvement of a process chamber of a sputtering apparatus in which a thin film is deposited on an upwardly facing substrate.

2. Description of the Related Art

Referring to FIGS. 7 and 8, examples of a process chamber in a conventional sputtering apparatus will be explained below.

FIG. 7 shows a first example of a conventional sputtering apparatus. This sputtering apparatus has both a face-down orientation means and a side-sputtering orientation means. The orientation of the substrate is such as to make its surface to be processed (hereinafter referred to as "processing surface") face downward or sideways. This orientation prevents dust particles from falling down on the processing surface of the substrate, thereby reducing the contamination by the dust particles of the processing surface. Here, the face-down orientation means is defined as one in which the orientation of the substrate is horizontal so as to make the processing surface of the substrate face downwardly. On the other hand, the side-sputtering orientation means is defined as one which orients the substrate vertically so as to make the processing surface face sideways during a sputtering process.

In FIG. 7, the first conventional sputtering apparatus includes a process chamber 51, a target 52 arranged in a vertically oriented manner, a target holding member 53, a ring-like target shield member 54, a substrate 55, a substrate holder 56 for mounting the substrate 55, a substantially cylindrical substrate holder shield member 57, and a cylindrical shield member 58. When depositing a thin film on the processing surface of the substrate 55, the substrate holder 56 is vertically oriented as shown by the solid line in FIG. 7. In this case, the surface of the substrate holder 56 is opposite the surface of the target 52. A plasma discharge 59 is generated between the substrate 55 and the target 52 to thereby perform thin film deposition. When transferring the substrate 55, the substrate holder 56 is horizontally oriented as shown by the broken line in FIG. 7. In this case, the processing surface of the substrate 55 faces downward. The substrate 55 is transferred in this orientation by means of a transfer means (not shown). Therefore, the substrate holder 56 can be turned as shown by an arrow 60, by means of an orienting means (not shown). As a result, the orientation of the substrate 55 on the substrate holder 56 is also changed. According to the face-down orientation, the dust particles can be prevented from falling down onto the processing surface because it faces downward during substrate transfer. According to the side-sputtering orientation, on the other hand, the dust particles fall down in the space between the substrate and the target by the action of gravity during the thin film deposition process. Accordingly, the influence of contamination by the dust particles of the processing surface of the substrate can be reduced. In FIG. 7, the first conventional sputtering apparatus further includes a gas inlet means 61 for introducing a process gas 62 into the process chamber 51, and another shield member 63.

The first conventional sputtering apparatus must have a transfer means for the face-down orientation and a thin film depositing means available for the sidesputtering orientation. Accordingly, the apparatus has a disadvantage that the transfer means becomes complicated and the volume of the process chamber becomes inevitably large. Further, the shield members are provided, at places where there is a possibility of deposition of the thin film, for the purpose of preventing the thin film from depositing on undesired portions such as the side surface of the substrate holder 56. The number of the shield members becomes relatively large and therefore the number of maintenance items increases. The apparatus has a further disadvantage that the pump-down time becomes long because the volume of the process chamber is large.

FIG. 8 is a vertical section showing a second example of the conventional sputtering apparatus. The sputtering apparatus has a face-up orientation means in which the processing surface of a substrate faces upward during the substrate transfer and during the thin film deposition because the amount of the dust particles generated is reduced due to a technical improvement. In FIG. 8, elements substantially the same as those in FIG. 7 are referenced correspondingly. In FIG. 8, in the process chamber 51 of the apparatus, the orientation of the substrate 55 does not change. Further, the process chamber 51 is provided with two gas inlet lines 61A,61B for each gas 62A,62B to flow, as shown by the broken line arrows, and a vacuum gauge 65 for measuring the pressure in the process chamber 51.

In the second conventional sputtering apparatus, since the orientation of the substrate is not changed in the process chamber 51, the volume of the process chamber 51 and the surface area thereof can be made small. As a result, the second conventional sputtering apparatus has an advantage that the pump-down time is shortened, and the shield configuration is integrally formed to thereby reduce the number of the shield members. Therefore the maintenance time can be shortened. Thus, the problems pointed out in the foregoing first conventional sputtering apparatus can be solved.

The second conventional sputtering apparatus, however, has a disadvantage in that the process gas cannot be sufficiently introduced to the plasma discharge space 59 because the space is substantially tightly enclosed by the cylindrical shield member 58, and because the locations of the gas inlet lines are limited because of the mechanical structure to the side wall of the process chamber and the substrate holder. Further, since the vacuum gauge 65 must be attached to the side walls of the process chamber because of the mechanical structure, the pressure in the plasma discharge space 59 cannot be accurately measured.

SUMMARY OF THE INVENTION

In view of the above problems, an object of the invention is to provide a sputtering apparatus in which the apparatus not only has the above-mentioned second configuration in which the volume and surface area of a process chamber can be made small but also a thin film of high and stable quality can be deposited on a substrate.

In order to attain the above object, according to an aspect of the invention, the sputtering apparatus in which transfer of the substrate and thin film formation on the substrate are performed in a face-up manner in a process chamber, comprises: a substrate holder for arranging the substrate horizontally with its surface facing upwardly opposite a target; means for generating a plasma discharge in the space in front of the substrate; a cylindrical shield member for surrounding the plasma discharge space so as to substantially tightly enclose the space, and a process gas inlet means having at least one opening for introducing the gas into the plasma discharge space.

According to the invention, the cylindrical shield member is provided so as to surround the space where the plasma discharge is generated, the front end of the process gas inlet means is incorporated into the cylindrical shield member, and the gas outlet opening is formed in the inner surface of the shield member. Thus, a process gas can be introduced directly into the plasma discharge space and can be sufficiently supplied so that the film quality can be stabilized and improved.

Preferably, the cylindrical shield member includes a ring-like or cylindrical path formed in the inside thereof, which is communicated with the process gas inlet means. The ring-like or cylindrical path has a plurality of gas outlet openings formed in an inner side wall thereof. Thus, the process gas can be dispersed through the plurality of outlet openings and this dispersing configuration contributes to stabilization of the film quality.

Preferably, a gas diffusion baffle may be provided in front of the gas outlet openings. Thus, it is also desirable to diffuse the process gas in the plasma discharge space by means of the diffusion baffle.

Preferably, a hole for inserting a pressure gauge is formed in the inner surface of the cylindrical shield member. Since the pressure in the plasma discharge space can be directly measured with the pressure gauge, the pressure fluctuation in the sputtering operation can be accurately measured.

DETAILED DESCRIPTION OF THE PREFERRED EMBODIMENTS

Next, preferred embodiments of the invention will be described with reference to the accompanying drawings.

Figure 1:
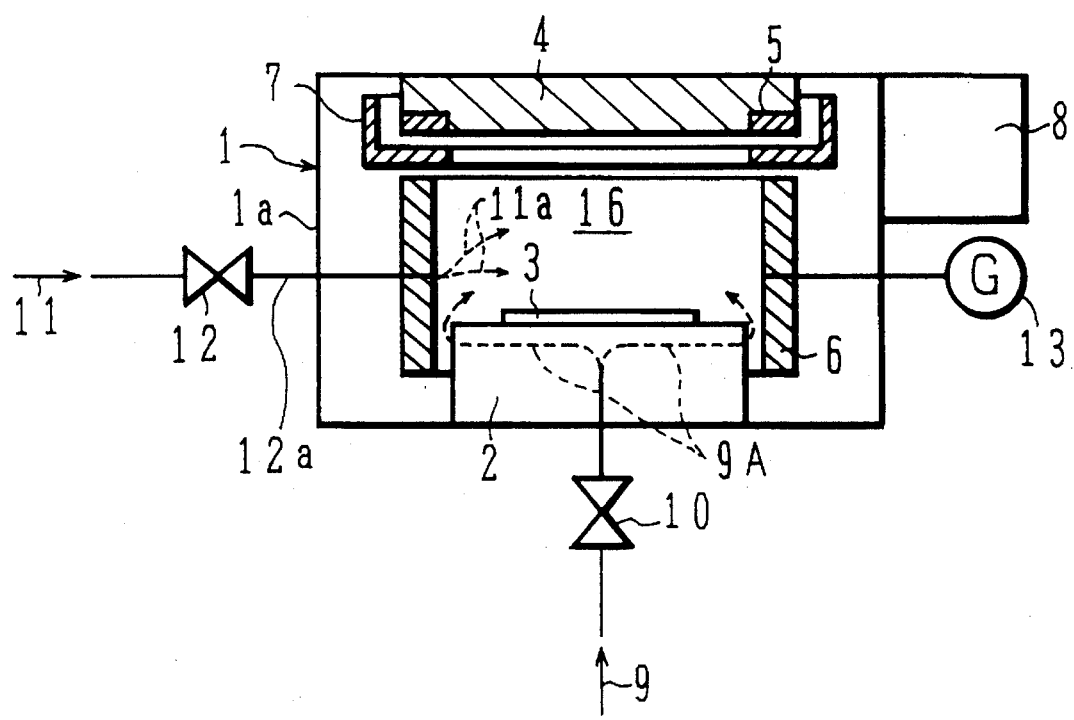
FIG. 1 is a vertical section showing an example of the sputtering apparatus according to the invention.
Figure 8:
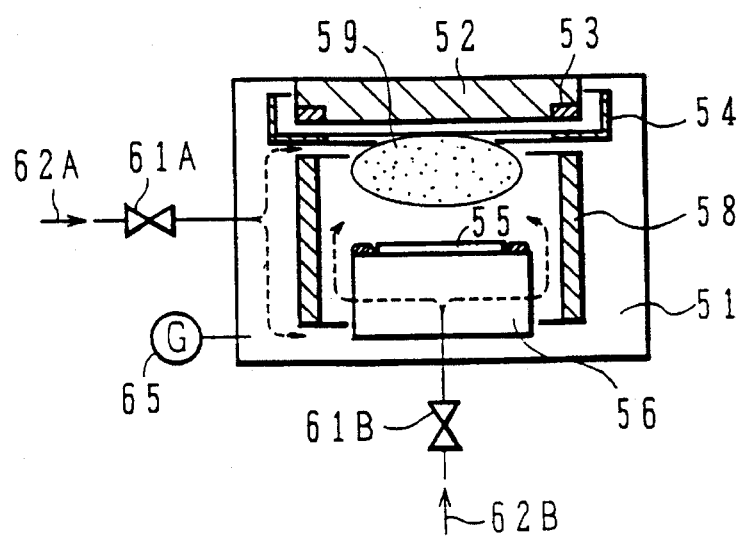
FIG. 8 is a section showing a second example of a conventional sputtering apparatus.

FIG. 1 shows a preferred embodiment of a process chamber of the sputtering apparatus according to the invention. This process chamber is an improvement of the process chamber explained with respect to FIG. 8. The basic structure of the process chamber of FIG. 1 is identical with that of the process chamber of FIG. 8. In the process chamber of the preferred embodiment, a substrate to be processed is arranged horizontally so as to make the processing surface thereof face upward.

In FIG. 1, the housing of the process chamber 1 is a vacuum vessel having an air-tight structure. Although the process chamber 1 has a means for supplying and withdrawing the substrate in a face-up manner and a means for transferring the substrate, illustration of these means are omitted from FIG. 1 for the sake of simplification. Further, the space within the process chamber 1 is kept in a pressure-reduced state (vacuum state) when the substrate is subjected to a sputtering process. To this end, the process chamber 1 is evacuated by a pump 8.

In FIG. 1, a substrate 3 is horizontally mounted in a face-up manner on the upper surface of a substrate holder 2. A target 4 is disposed above the substrate 3 so that the surface of the target 4 is parallel to and faces the processing surface of the substrate 3. A target mounting member 5 is provided for mounting the target 4. In the space 16 between the substrate 3 and the target 4, a plasma discharge is generated, and, for example, a cylindrical shield member 6 is disposed surrounding the space 16. Although a standard means for generating the plasma discharge is provided in the process chamber 1, illustration thereof is omitted from the drawing. Further, although the shield member 6 is fixed in the process chamber 1, illustration of a structure therefore is also omitted. A ring-like target shield member 7 is disposed in such a manner that the gap between the shield member 6 and the ring-like target shield member 7 is relatively narrow. The shield member 6 and the substrate holder 2 are arranged in such a manner that the gap therebetween is also narrow. As a result, the space 16 is substantially tightly enclosed by the shield member 6.

As an example, two means for respectively introducing different process gases (for example, Ar and $N_2$) used for the sputtering process are provided for the process chamber 1. A first process gas 9 is introduced through a gas inlet means 10 into a space below the substrate holder 2 and a second process gas 11 is introduced into the process chamber 1 through a gas inlet means 12 provided in a side wall 1a. The first process gas 9 is further introduced into the plasma discharge space 16 through a plurality of inlet holes (not shown) surrounding the upper portion of the substrate holder 2, as shown by broken lines 9A in FIG. 1. Inlet pipe 12a of the gas inlet means 12 extends through the side wall 1a to the inside space of the shield member 6. A gas outlet opening of the gas inlet pipe 12a is formed in the inner surface of the shield member 6.

Through the above-mentioned gas inlet means 12, the second process gas 11 is directly introduced into the plasma discharge space 16 enclosed by the shield member 6, as shown by broken lines 11A in FIG. 1. Some examples of the gas outlet structure will be described later.

A hole for introducing a vacuum gauge 13 is formed in the shield member 6. The opening of the introduction hole is formed on the inner surface of the shield member 6 and faces the plasma discharge space 16. A diaphragm manometer for accurately measuring pressure in the range of from about 0.1 mTorr to 20 mTorr is used as the vacuum gauge 13.

According to the above-mentioned configuration, the process gas 11 can be introduced directly into the plasma discharge space 16 tightly enclosed by shield member 6 by means of the gas inlet means 12. Accordingly, the process gas 11 can be stably supplied in a requisite amount. Further, since the pressure in the plasma discharge space 16 can be directly measured by means of the vacuum gauge 13, accurate pressure information can be obtained. Further, by using this accurate pressure information, the quantity of process gas necessary for thin film formation can be accurately introduced.

Next, other specific examples of the outlet structure for the gas inlet means 12, in the shield member 6, will be described.

Figure 2:
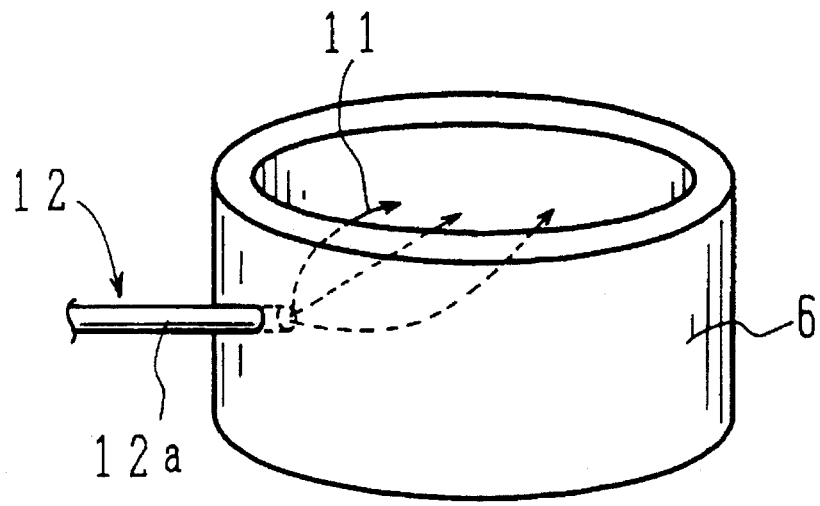
FIG. 2 is a perspective view showing a preferred embodiment of the shield member.

FIG. 2 shows the structure of FIG. 1 in greater detail. In FIG. 2, only one gas outlet opening at the front end of the gas inlet pipe 12a is formed in the inner surface of the shield member 6. The process gas 11 flows out through the outlet opening into the plasma discharge space 16. The number of inlet pipes 12a may be increased so that the number of outlet openings in the inner surface of the shield member 6 can be increased.

Figure 3:
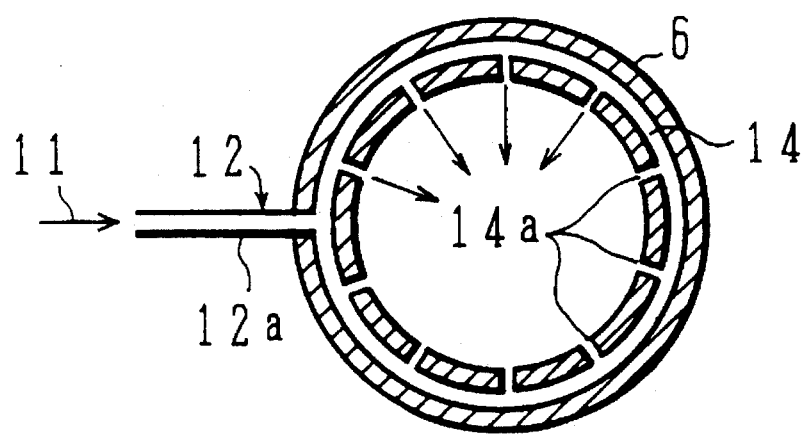
FIG. 3 is a cross section showing another preferred embodiment of the shield member.
Figure 4:
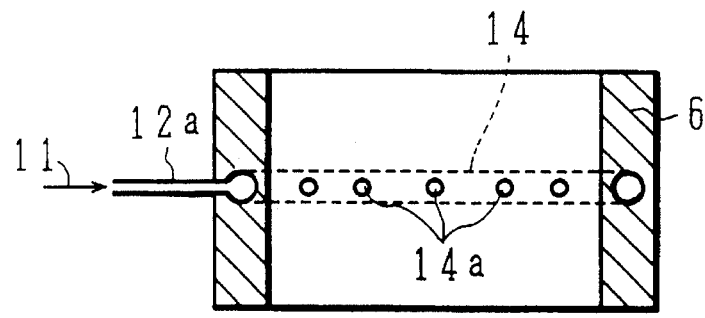
FIG. 4 is a vertical section of the shield member of FIG. 3.

In the structure shown in FIGS. 3 and 4, a ring-like path 14 is formed in the inside of the shield member 6 so as to communicate with the inlet pipe 12a and a plurality of small holes 14a are formed in the inner wall surface of the path 14 so as to communicate with the inside space of the shield member 6. The plurality of small holes 14a are formed at suitable regular or irregular intervals around the periphery of the inner wall surface of the shield member. Thus, each of the small holes 14a acts as a gas outlet opening. In such a structure, the process gas 11 is introduced into the plasma discharge space 16 through the ring-like path 14 and the small holes 14a. Accordingly, the process gas is uniformly diffused into the plasma discharge space 16.

Figure 5:
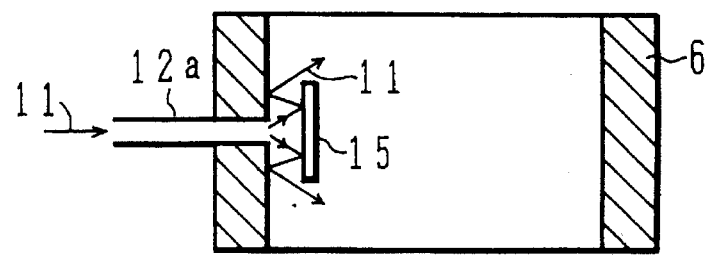
FIG. 5 is a vertical section showing a further preferred embodiment of the shield member.

The structure shown in FIG. 5 is different from that of FIG. 2 in that a diffusion baffle 15 is provided in front of the gas inlet opening of the gas inlet pipe 12a. With the diffusion baffle 15, the process gas 11 is diffused in the plasma discharge space 16. The diffusion baffle 15 functions also as a shield member.

Figure 6:
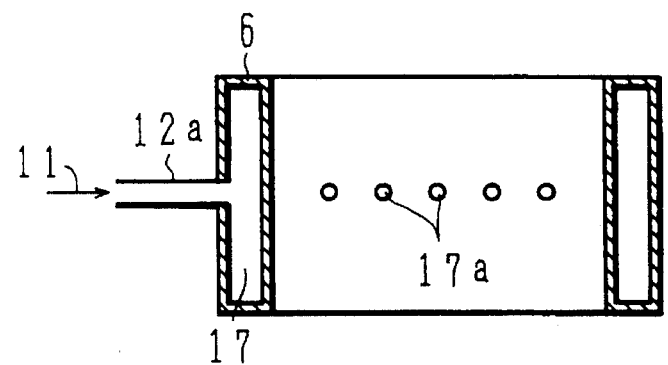
FIG. 6 is a vertical section of a still further preferred embodiment of the shield member.
Figure 7:
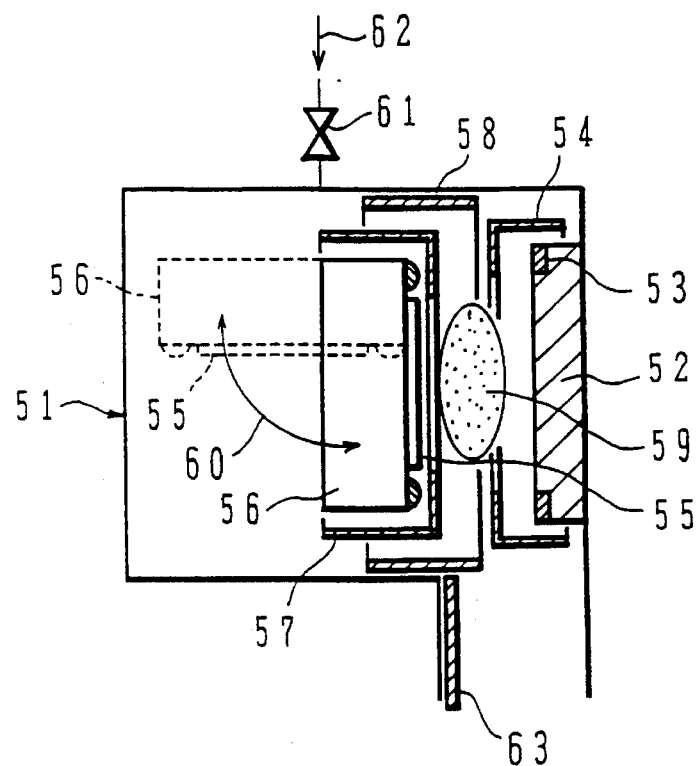
FIG. 7 is a section showing a first example of a conventional sputtering apparatus.

As shown in FIG. 6, a cylindrical path 17 and small holes 17a may be formed in the shield member 6 in place of the ring-like path 14 of FIG. 4.

In each of the foregoing embodiments, the shield member 6 may be integrally formed or comprised of several separate elements.

The invention has technical effects as follows. According to the face-up orientation means, a thin film is deposited on a substrate held horizontally with the processing surface facing upward. A process gas inlet means is provided so that its gas outlet opening is formed in the inner surface of the shield member which surrounds the plasma discharge space. Accordingly, the process gas is introduced stably in a requisite quantity so that the quality of the thin film to be deposited onto the substrate is stabilized.

The introduced process gas may be dispersed by increasing the number of gas outlet openings or by providing a diffusion baffle in the plasma discharge space to thereby further improve the stabilization of the film quality.

Further, since the pressure in the plasma discharge space is directly measured by means of the vacuum gauge, accurate pressure information can be obtained. Accordingly, the invention largely contributes to stable operation and an improvement in the yield of the sputtering apparatus mainly for mass-producing semiconductors.

What is claimed is:

1. A sputtering apparatus including a process chamber in which transfer of a substrate and formation of a thin film on the substrate are performed in a face-up manner, said sputtering apparatus comprising:

a substrate holder for supporting the substrate horizontally with the processing surface thereof made to face upward and opposite a target;

a means for generating a plasma discharge in a plasma discharge space in front of said substrate;

a cylindrical shield member for substantially tightly enclosing the plasma discharge space;

a process gas inlet means having at least one gas outlet opening formed in an inner surface of said cylindrical shield member; and a pressure gauge having a sensor portion positioned in an opening formed in the inner surface of said cylindrical shield member.

2. A sputtering apparatus according to claim 1, in which said cylindrical shield member has a ring-like path formed in the inside thereof so as to surround said plasma discharge space and to communicate with said process gas inlet means, said ring-like path having a plurality of gas outlet openings formed in an inner wall which defines said ring-like path.

3. A sputtering apparatus according to claim 1, in which said cylindrical shield member has a cylindrical path formed in the inside thereof so as to surround said plasma discharge space and to communicate with said process gas inlet means, said cylindrical path having a plurality of gas outlet openings formed in an inner side wall which defines said cylindrical path.

4. A sputtering apparatus according to claim 1, in which a gas diffusion means is provided in front of said gas outlet opening.

5. A sputtering apparatus according to claim 4, in which said gas diffusion means is a cylindrical wall spaced apart from said cylindrical shield member.

* * * * *